United States Patent
Mori

(10) Patent No.: US 9,078,363 B2
(45) Date of Patent: Jul. 7, 2015

(54) WIRING BOARD AND DISPLAY APPARATUS

(75) Inventor: Junichi Mori, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 515 days.

(21) Appl. No.: 13/508,734

(22) PCT Filed: Jul. 1, 2010

(86) PCT No.: PCT/JP2010/061269
§ 371 (c)(1),
(2), (4) Date: May 9, 2012

(87) PCT Pub. No.: WO2011/061961
PCT Pub. Date: May 26, 2011

(65) Prior Publication Data
US 2012/0235713 A1    Sep. 20, 2012

(30) Foreign Application Priority Data

Nov. 18, 2009  (JP) .................................. 2009-262768

(51) Int. Cl.
*G09G 3/20* (2006.01)
*H05K 1/02* (2006.01)
*G02F 1/1345* (2006.01)

(52) U.S. Cl.
CPC ............ *H05K 1/0289* (2013.01); *G09G 3/2092* (2013.01); *H05K 2201/10136* (2013.01); *G02F 1/13452* (2013.01)

(58) Field of Classification Search
CPC ............................ G09G 3/2092; H05K 1/0289
USPC ........................................................ 174/261
See application file for complete search history.

(56) References Cited

U.S. PATENT DOCUMENTS 6,433,767 B1    8/2002    Murade
6,433,841 B1    8/2002    Murade et al.
(Continued)

FOREIGN PATENT DOCUMENTS

JP    2000-162635 A    6/2000
JP    2005-091962 A    4/2005
(Continued)

OTHER PUBLICATIONS

Official Communication issued in International Patent Application No. PCT/JP2010/061269, mailed on Sep. 7, 2010.

*Primary Examiner* — Jeremy C Norris
(74) *Attorney, Agent, or Firm* — Keating & Bennett, LLP

(57) ABSTRACT

The present invention provides a wiring board wherein the resistance difference between multiple connection lines is reduced. The wiring board of the present invention comprises: a control region and a peripheral region. The control region includes multiple gate lines extending in a row direction and multiple source lines extending in a column direction. The peripheral region includes a gate driver connected with the gate lines; a source driver connected with the source lines; and multiple connection lines which extend around the control region and which connect the gate driver with the gate lines. Each of the connection lines includes a gate metal portion formed from a material of the gate lines and a source metal portion formed from a material of the source lines. An insulating layer is disposed between the gate metal portion and the source metal portion. The gate metal portion and the source metal portion are connected with each other via a contact portion which penetrates the insulating layer.

10 Claims, 4 Drawing Sheets

(56) References Cited

U.S. PATENT DOCUMENTS

| | | |
|---|---|---|
| 2002/0145683 A1 | 10/2002 | Murade et al. |
| 2002/0175888 A1 | 11/2002 | Murade |
| 2003/0184705 A1 | 10/2003 | Murade et al. |
| 2006/0138461 A1 | 6/2006 | Abe et al. |

FOREIGN PATENT DOCUMENTS

| | | |
|---|---|---|
| JP | 2008-003118 A | 1/2008 |
| JP | 2008-064961 A | 3/2008 |
| JP | 2009-115940 A | 5/2009 |

WIRING BOARD AND DISPLAY APPARATUS

TECHNICAL FIELD

The present invention relates to a wiring board and a display apparatus. The present invention specifically relates to a wiring board suitably used as a substrate constituting a panel of a display apparatus, and a display apparatus including the wiring board.

BACKGROUND ART

There is a demand for much smaller, lighter-weight portable electronic devices, such as mobile phones and PDA, equipped with a display panel such as a liquid crystal display panel or an organic electroluminescence display panel. In such situation, downsizing of vicinities of the display region, that is to say frame downsizing, tends to be intended and frame-downsizing techniques are eagerly developed.

In these electronic devices, a display region is provided with multiple gate lines (scanning signal lines) and multiple source lines (image signal lines) so as to achieve high-definition display. The gate lines are driven by a gate driver and the source lines are driven by a source driver. These lines are connected with the corresponding drivers via connection lines disposed outside the display region.

In the region where connection lines are disposed (frame region), each distance between adjacent connection lines tends to be made narrower as a result of frame downsizing, and thus electric short-circuit is likely to occur between the connection lines. In order to avoid such a problem, multiple connection lines are formed in different layers with an insulating film separated therebetween, and thereby two connection lines are disposed in a space which is conventionally used for only a single line (for example, see Patent Documents 1 to 3).

Patent Document 1: JP 2005-91962 A
Patent Document 2: JP 2008-64961 A
Patent Document 3: JP 2009-115940 A

SUMMARY OF THE INVENTION

Problems to be Solved by the Invention

The present inventor has performed various studies about a method for frame downsizing by forming connection lines in different layers with an insulating film separated therebetween, and thereby found that resistance difference can occur between connection lines due to process variations of the connection lines which are formed individually.

FIG. 7 is a schematic plan view showing one example of arrangement of connection lines for frame downsizing. As shown in FIG. 7, in a display region P, multiple gate lines 111 extend in the row direction and multiple source lines 112 extend in the column direction. In a peripheral region, a gate driver 121 is disposed. Multiple connection lines 130, that is, a connection line connected with a gate line of the first row, a connection line connected with a gate line of the second row, a connection line connected with a gate line of the third row, and so on, extend from both ends of the gate driver 121 alternately. The connection lines 130 passing through the peripheral region are connected with the corresponding gate lines 111 of the display region P.

In other words, connection lines 130 connected with odd-numbered gate lines 111, such as a connection line connected with the first gate line, a connection line connected with the third gate line, a connection line connected with the fifth gate line, and so on, extend from one end of the gate driver 121 from the outside, whereas connection lines 130 connected with even-numbered gate lines 111, such as a connection line connected with the second gate line, a connection line connected with the fourth gate line, the sixth gate line, and so on, extend from the other side of the gate driver 121 from the outside.

Extending of the connection lines 130 from both left and right ends of the gate driver 121 alternately allows the display region P to be placed at the center and allows the frame to be downsized.

Further, connection lines formed from different materials such as connection lines 131 (solid line) formed from a material used for the gate lines 111 (hereinafter, also referred to as a gate metal) and a connection lines 132 (broken line) formed from a material used for the source lines 112 (hereinafter, also referred to as a source metal) extend from both ends of the gate driver 121 alternately. Such line arrangement exerts a good frame-downsizing effect as mentioned later.

FIG. 8 is a schematic cross-sectional view along the E-F line in FIG. 7. As shown in FIG. 8, the respective lines are formed on an insulation substrate 123 made of a material such as glass. The connection lines 130 in the peripheral region extend in different two layers. Connection lines 131 disposed in a lower layer are gate-metal connection lines, whereas connection lines 132 disposed in an upper layer are source-metal connection lines. A first insulating layer 124 is disposed between the gate-metal connection lines 131 and the source-metal connection lines 132, and a second insulating layer 125 is disposed on the source-metal connection line 132 disposed in the upper layer.

The connection lines formed in different two layers can suppress occurrence of short-circuit even though the distance between adjacent connection lines are reduced for the purpose of frame downsizing.

When the present inventor actually produced a wiring board with the aforementioned arrangement to perform a study on the wiring board, however, the inventor has found the following. That is, process variations are observed such as variations in width or thickness of the formed connection lines 131 in the lower layer and the formed connection lines 132 in the upper layer, as shown in FIG. 8. As a result, resistance difference occurs between the connection lines 131 and 132 in the respective layers and variations in signal transmission occur due to signal delay between the gate lines 111 connected with the respective connection lines 131 and 132. The present inventor has applied such a wiring board to a liquid crystal display apparatus and found the following. That is, the variations in signal transmission affect the effective voltage between the liquid crystals of the respective pixels in the display region P. This causes occurrence of unevenness in brightness in a moire (fringe)-shaped periodic horizontal stripe pattern along the gate lines 111 as shown in FIG. 9, resulting in deterioration in display quality. FIG. 9 is a photographic image showing unevenness in brightness (moire) in a display region in the arrangement of the connection lines as shown in FIG. 7.

Such unevenness in brightness in a horizontal stripe pattern extremely occurs particularly in the case of a two-layer line arrangement in which connection lines are individually formed in the respective layers. In the case of forming connection lines in a single-layer line arrangement, no resistance difference occurs between adjacent gate lines even though variations in width and thickness occur due to process variations. Thus, unevenness in brightness gradually changes and hardly affects the display quality.

In the case that the connection lines extend from both ends of the gate driver alternately and the gate-metal connection lines and the source-metal connection lines alternately extend from one of the sides, the pitches between the bright and dark portions in the unevenness in brightness are widened. Thus, moire-shaped horizontal stripes are particularly clearly observed.

The present invention is devised in consideration of the above situation, and aims to provide a wiring board with reduced resistance difference between multiple connection lines.

Means for Solving the Problems

The present inventor has performed various studies on the above problems, and focused on an arrangement that connection lines are formed in different layers. Then, the inventor has found that formation of a contact portion which connects connection lines formed in different layers at a certain part of each connection line enables to form one connection line from multiple lines formed in different layers. Further, the inventor has found that the above arrangement can solve resistance difference between adjacent connection lines even though process variations occur, and a robust design against process variations can be obtained.

In other words, the present invention relates to a wiring board, comprising: a control region including multiple gate lines extending in a row direction and multiple source lines extending in a column direction; and a peripheral region including a gate driver connected with the gate lines, a source driver connected with the source lines, and multiple connection lines which extend around the control region and which connect the gate driver with the gate lines, each of the connection lines including a gate metal portion formed from a material of the gate lines and a source metal portion formed from a material of the source lines, an insulating layer being disposed between the gate metal portion and the source metal portion, and the gate metal portion and the source metal portion being connected with each other via a contact portion which penetrates the insulating layer.

The wiring board of the present invention comprises a control region including multiple gate lines extending in the row direction and multiple source lines extending in the column direction. The control region may be used as, for example, a display region in which a region surrounded by gate lines and source lines is regarded as one pixel. Further, the respective pixels can be individually controlled by disposing a switching element adjacent to each of the intersection points of the gate lines and the source lines. Examples of the switching element include a three-terminal thin film transistor (TFT). When a gate voltage is applied to a switching element through a gate line, a source signal (for example, an image signal) is applied to the corresponding pixel through a source line. Thereby, the display region can be controlled in an active matrix driving mode. In other words, the wiring board preferably has a switching element for each pixel surrounded by the gate lines and the source lines, and the switching element is preferably a thin film transistor. A wiring board in which a matrix-like region is controlled using active elements such as TFTs is also referred to as an active matrix substrate.

The wiring board of the present invention comprises a peripheral region that includes a gate driver connected with the gate lines, a source driver connected with the source lines, and multiple connection lines that extend around the control region and that connect the gate driver with the gate lines. The peripheral region is a region except the control region, and can be used as a space for disposing a driver connected with gate lines or source lines, or a space for introducing connection lines into the control region from the driver.

Each of the connection lines has a gate metal portion formed from a material of the gate lines and a source metal portion formed from a material of the source lines. The gate lines and the gate metal portions of the connection lines can be formed by the same process, and the source lines and the source metal portions of the connection lines can be produced by the same process. Thus, in the present invention, the producibility can be higher than in the case that gate lines and connection lines, or source lines and connection lines are formed under different production conditions and formed from different materials.

Since the wiring board of the present invention can solve resistance difference between connection lines due to difference in production conditions and material, the wiring board of the present invention can be particularly suitably used in the case of producing the gate metal portion and the source metal portion under different conditions. Further, the wiring board of the present invention can be particularly suitably used in the case that the material of the gate metal portion is different from that of the source metal portion. Therefore, a degree of freedom in selecting production conditions and line materials increases, and production conditions which give better productivity can be selected.

An insulating layer is disposed between the gate metal portion and the source metal portion. Since the insulating layer separates the connection lines into two different layers, the frame can be downsized while possibility of occurring short-circuit between adjacent connection lines is reduced.

The gate metal portion and the source metal portion are connected with each other via a contact portion which penetrates the insulating layer. Formation of a communicating portion between the gate metal portion and the source metal portion inside the insulating layer enables to form one connection line in multiple layers while achieving a frame-downsizing effect.

As mentioned above, in the wiring board of the present invention, a contact portion connecting the gate metal portion and the source metal portion is formed at a certain part of each connection line. Since the gate metal portion and the source metal portion are formed by different steps in general, process variations are likely to occur between these steps. Examples of causes of resistance difference between gate lines include difference in width and thickness of connection lines and difference in specific resistance between materials. Process variations generate resistance difference between connection lines, and thus cause signal delay. It is, however, difficult to prevent variations in width and thickness in connection lines in practice. Further, difference in specific resistance between materials cannot be changed essentially. For example, tantalum and aluminum have different specific resistances as shown in the following Table 1, and it is difficult to obtain the same resistance per unit length while the difference in width and thickness between lines is within a practical range.

TABLE 1

|  | Tantalum (Ta) | Aluminum (Al) |
|---|---|---|
| Specific resistance ($\Omega \cdot m$) | $1.31 \times 10^{-7}$ | $2.65 \times 10^{-8}$ |
| Thickness (Å) | 1500 to 2500 | 750 to 1500 |
| Width (μm) | 4 to 5 | 4 to 5 |
| Resistance per unit length ($\Omega/m$) | 104 to 220 | 35 to 88 |

Thus, in the present invention, a contact portion between the gate metal portion and the source metal portion is formed at a certain part of each connection line and one connection line is formed from two lines produced by two different steps. Thereby, resistance difference as a whole is solved.

As a result, regardless of process variations and materials, signals are transmitted to the respective gate lines at the same transmission speed. Therefore, deterioration in display quality, such as occurrence of moire, can be suppressed even though the wiring board of the present invention is used for a display apparatus.

In the present invention, the number of contact portions (connecting points) is not particularly limited; at least one contact portion exists therein.

The configuration of the wiring board of the present invention is not especially limited by other components as long as it essentially includes such components.

The following will describe preferable modes of the wiring board of the present invention in detail.

Preferably, connection lines formed from different materials alternately extend from the gate driver. In other words, the gate metal portion of one connection line and the source metal portion of its adjacent connection line are preferably adjacent to each other. Thereby, the adjacent connection lines are easily disposed in the upper and lower layers separately and frame downsizing can be easily achieved.

Preferably, the wiring board comprises multiple source connection lines connecting the source driver and the source lines, and connection lines formed from different materials alternately extend from the source driver. In the case that the connection lines connecting the source lines and the source driver are formed from different materials, adjacent connection lines connected with the source lines can be formed in different layers. Thus, frame downsizing can be achieved while the possibility of short-circuit between adjacent connection lines is reduced.

Preferably, the multiple connection lines alternately extend from the gate driver, and the connection lines alternately extending from both the left and right ends of the driver are connected with the gate lines in an ascending order of the row number thereof. In such a mode, the connection lines extending from either one end of the gate driver are connected with the odd-numbered gate lines, whereas the connection lines extending from the other end of the gate driver are connected with the even-numbered gate lines. Thus, the effect of frame downsizing can be achieved while the control region is placed at the center. In the case of applying the wiring board with such line arrangement to a display apparatus, the wiring board may have wider pitches between dark and bright horizontal stripes due to resistance difference of the gate lines, so that the horizontal stripes may possibly be observed more clearly. The effects of the present invention, however, suppress occurrence of horizontal stripes, and thus the present mode is particularly preferable.

The ratio of the length of the gate metal portion and that of the source metal portion to the whole length of each connection line are preferably substantially identical among the connection lines. Thereby, resistance difference between the connection lines can be more reduced.

The contact portion is preferably formed at substantially the middle point of each of the connection lines. Thereby, each connection line is evenly divided into a gate metal portion and a source metal portion, so that resistance difference between the connection lines can be more reduced.

The contact portions of a pair of the connection lines adjacent to each other are preferably placed at different positions in the column direction. In order to form contact portions, the areas of the connection lines are preferably large at the regions in each of which the contact portion of the connection line is to be formed. Thus, formation of contact portions at different positions in the column direction so as not to make the contact portions adjacent to each other in the row direction can prevent an increase in the area of the frame region.

In the case that the wiring board of the present invention has a switching element for each pixel surrounded by the gate lines and the source lines, the polarity of pixels in one column is preferably different from that of pixels in an adjacent column. In other words, the wiring board of the present mode is a column-inversion-driving (source-inversion-driving) wiring board.

Also in the case that the wiring board of the present invention has a switching element for each pixel surrounded by the gate lines and the source lines, the polarity of one pixel is preferably different from that of an adjacent pixel. In other words, the wiring board of the present mode is a dot-inversion-driving wiring board.

In the polarity inversion driving in which the pixels are recharged when a gate signal falls, the resistance difference between the gate lines is likely to cause difference in brightness, and especially moire is likely to be clearly observed. In contrast, the wiring board of the present invention can suppress occurrence of signal delay between the gate lines. Thus, the effects of the polarity inversion driving such as prevention of flicker and image-sticking can be achieved, and also deterioration in display quality can be suppressed.

The present invention also relates to a display apparatus comprising the wiring board. In a display apparatus comprising the wiring board of the present invention, the frame region is narrow, short-circuit between the connection lines is less likely to occur, and deterioration in display quality such as occurrence of moire is less likely to occur.

Effects of the Invention

The wiring board of the present invention can reduce resistance difference between the lines of the multiple connection lines. In the display apparatus of the present invention, the frame region is narrow, short-circuit between the connection lines is less likely to occur, and deterioration in display quality such as occurrence of moire is less likely to occur.

MODES FOR CARRYING OUT THE INVENTION

Figure 1:
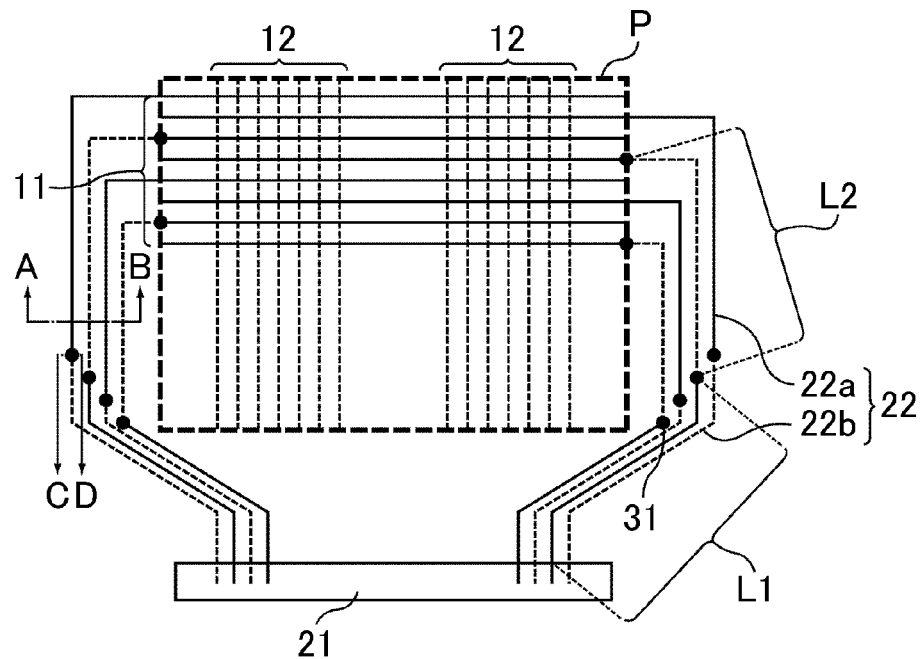
FIG. 1 is a schematic plan view showing the line arrangement of an active matrix substrate of Embodiment 1.

The present invention will be mentioned in more detail referring to the drawings in the following embodiments, but is not limited to these embodiments.

Embodiment 1

Embodiment 1 shows one example of the active matrix substrate (wiring board) of the present invention which can be used as a substrate of a liquid crystal display panel. FIG. 1 is a schematic plan view showing the line arrangement of the active matrix substrate of Embodiment 1. As shown in FIG. 1, the active matrix substrate of Embodiment 1 comprises a display region (control region) P provided with multiple gate lines 11 and multiple source lines 12. The gate lines 11 extend in the row direction and the source lines 12 extend in the column direction.

At positions adjacent to the respective intersections of the gate lines 11 and the source lines 12 are disposed TFTs which serve as switching elements, and each TFT is connected with a pixel electrode. The pixel electrode is an electrode disposed at a region (pixel) surrounded by gate lines 11 and source lines 12. When a gate voltage is applied to the TFTs through the gate lines 11, an image signal is supplied to the pixels through the source lines 12. In other words, switching function of the TFTs enables to control voltage application per pixel, so that precise active matrix driving can be performed.

The active matrix substrate of Embodiment 1 comprises a gate driver 21 at a peripheral region. Multiple connection lines 22 extend from the gate driver 21 in order, and the connection lines 22 extend around the display region P and then connected with the corresponding gate lines 11. The connection lines 22 extend in the column direction and bend at a certain part.

Among the multiple connection lines 22, connection lines 22 extending from both left and right ends of the gate driver 21 alternately from the outside are connected with the gate lines 11 in an ascending order of the row number, that is, the first-row gate line, the second-row gate line, the third-row gate line, and so on.

In other words, connection lines 22 connected with the odd-numbered gate lines 11, such as a connection line connected with the first-row gate line, a connection line connected with the third-row gate line, the fifth-row gate line, and so on, extend from one end of the gate driver 21, whereas connection lines 22 connected with the even-numbered gate lines 11, such as a connection line connected with the second-row gate line, a connection line connected with the fourth-row gate line, the sixth-row gate line, and so on, extend from the other end of the gate driver 21.

As mentioned above, the connection lines 22 extending from both ends of the gate driver 21 alternately enables to place the display region P at the center and to downsize the frame.

Each source line 12 is connected with a source driver that is separately provided.

Each connection line 22 comprises a gate metal portion 22a and a source metal portion 22b. With respect to the connection lines 22 shown in FIG. 1, portions illustrated by solid lines are the gate metal portions 22a and portions illustrated by broken lines are the source metal portions 22b. The gate metal portions 22a are formed from the same material as the gate lines 11 at the display region P by the same process (steps). The source metal portions 22b are formed from the same material as the source lines at the display region P by the same process (steps).

In the active matrix substrate of Embodiment 1, the gate lines 11 and the gate metal portions 22a of the connection lines 22 are first formed, then an insulating layer is formed, and finally the source lines and the source metal portions 22b of the connection lines 22 are formed. Thus, the gate metal portions 22a and the source metal portion 22b are formed in different layers with the insulating layer disposed therebetween.

The gate metal portions 22a and the source metal portions 22b are connected with each other via a contact portion 31 formed at an intermediate portion of each connection line 22, and the connection line 22 shifts to a different layer at this point.

In the case of forming each connection line from two line portions that are formed by two different steps, resistance difference between the connection lines can be solved even though the connection lines are formed under different conditions or formed from different materials.

In Embodiment 1, a connection line 22 formed from a gate metal 22a, a connection line 22 formed from a source metal 22b, a connection line 22 formed from a gate metal 22a, and so on extend from one end of the gate driver 21 in order from the outside. In other words, an extending portion that is a gate metal portion 22a and an extending portion that is a source metal portion 22b extend from one end of the gate driver 21 alternately. Owing to such an extending method, the gate metal portions 22a and the source metal portions 22b are disposed in order alternately.

As mentioned above, the frame can be easily downsized by allowing the lines formed from a gate metal and the lines formed from a source metal to extend from the gate driver alternately, that is, producing adjacent connection lines by different production processes, in different layer arrangements, and from different materials.

Such an extending method is effective to downsize the frame, but causes wider pitches of gate lines that generate resistance difference. As a result, the pitches of horizontal stripes may become wider and moire may be more clearly observed. In the active matrix substrate of Embodiment 1, however, the structure thereof sufficiently removes resistance difference between the gate lines. Thus, occurrence of moire is suppressed and good display can be achieved.

In Embodiment 1, the position of the contact portion 31 between the gate metal portion 22a and the source metal portion 22b is not particularly limited as long as it is formed at a certain part of the connection line 22. At any point, resistance difference between the connection lines 22 can be reduced.

In order to greatly reduce resistance difference between the connection lines 22, the ratio of the length of the gate metal portion 23a and that of the length of the source metal portion 23b to the whole length of the connection line is preferably substantially identical among the connection lines 22.

As shown in FIG. 1, the contact portion 31 between the gate metal portion 22a and the source metal portion 22b is formed at substantially the middle point of each connection line 22, and thus the length L1 of the gate metal portion 22a is equal to the length L2 of the source metal portion 22b in one connection line 22. Therefore, resistance difference between the connection lines 22 can be more easily removed.

Figure 2:
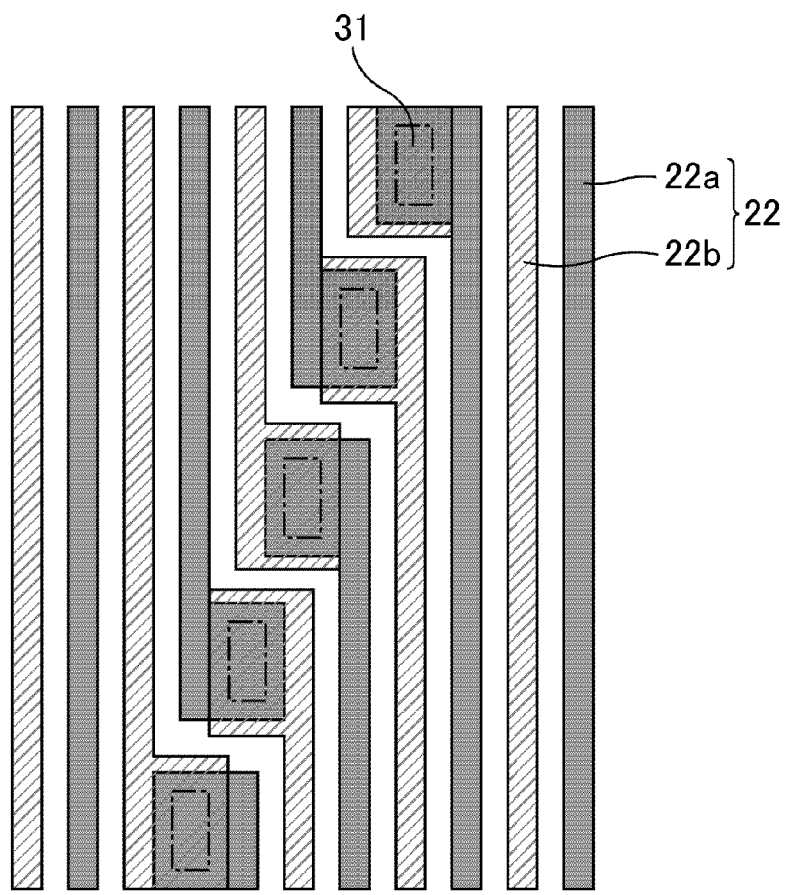
FIG. 2 is an enlarged view of connecting portions of connection lines.

FIG. 2 is an enlarged view of the contact portions of the connection lines. As shown in FIG. 2, regions near the contact portions 31 are formed wider than the line portions. Thus, contact holes can be more easily formed through the insulating layer. In Embodiment 1, the contact portions 31 are disposed at different positions in the column direction in adjacent connection lines 22. As a result, an increase in the width of the peripheral portion due to arrangement in the row-direction of wide portions in each of which a contact portion 31 is to be formed can be prevented, which greatly contributes to frame downsizing.

Figure 3:
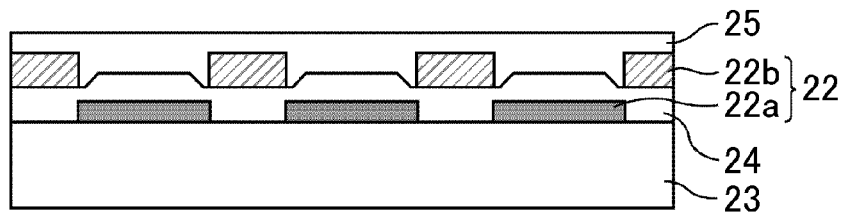
FIG. 3 is a schematic cross-sectional view along the A-B line in FIG. 1.

FIG. 3 is a schematic cross-sectional view along the A-B line in FIG. 1. As shown in FIG. 3, the lines are formed on an insulation substrate 23 formed from a material such as glass, and each connection line 22 is divided into two layers at the peripheral region. The connection line 22a disposed in a lower layer is formed from a gate metal and the connection line 22b disposed in an upper layer is formed from a source metal. A first insulating layer 24 is formed between the connection line 22a disposed in the lower layer and the connection line 22b disposed in the upper layer, and a second insulating layer 25 is formed on the connection line 22b disposed in the upper layer. Examples of the materials of the first insulating layer 24 and the second insulating layer 25 include silicon oxide ($SiO_2$) and silicon nitride ($SiN_x$).

As shown in FIG. 3, the connection lines 22a formed from a gate metal and the connection lines 22b formed from a source metal have different widths and thicknesses due to process variations. In the structure of Embodiment 1, however, each connection line 22 comprises a gate metal portion 22a and a source metal portion 22b. Thus, occurrence of resistance difference between the connection lines 22 can be suppressed. In Embodiment 1, the connection line 22a formed from a gate metal and the connection line 22b formed from a source metal may be placed conversely, that is, the connection lines 22a formed from a gate metal may be placed in the upper layer and the connection lines 22b may be placed in the lower layer.

Figure 4:
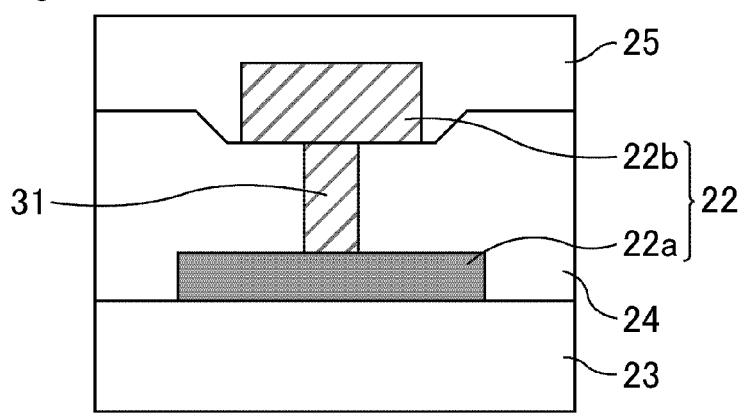
FIG. 4 is a schematic cross-sectional view along the C-D line in FIG. 1.

FIG. 4 is a schematic cross-sectional view along the C-D line in FIG. 1. As shown in FIG. 4, the contact portion 31 is disposed inside the first insulating layer 24. A conductive material constituting the inside of the contact portion 31 may be a gate metal or may be a source metal. From the viewpoint of production steps, the material is preferably the material of the source metal portion (source metal) formed in the upper layer.

The cross-sectional structure thereof can be observed using a cross-sectional SEM (scanning electron microscope) or an optical microscope.

Specific examples of the materials of the gate metal and the source metal include metals such as tantalum (Ta), aluminum (Al), tungsten (W), and copper (Cu), and nitrides of these metals.

The active matrix substrate of Embodiment 1 can perform active matrix driving in each pixel as mentioned above. In the case of a liquid crystal display apparatus, for example, a common electrode is formed on the entire surface as an opposite substrate in addition to an active matrix substrate as in Embodiment 1, and a liquid crystal layer is formed between these substrates. Thereby, the liquid crystal can be driven per pixel.

More specifically, the active matrix substrate of Embodiment 1 may employ dot inversion driving in which the sign (positive or negative) of the voltage of one pixel is different from that of an adjacent pixel, or may employ column (source) inversion driving in which the sign (positive or negative) of the voltage of one column is different from that of an adjacent column, as a countermeasure for flicker and image-sticking. As mentioned above, in the driving mode of inverting the polarity per column or per pixel with a common electrode signal driven by DC (direct current), pixel recharging occurs upon gate signal falling due to gate signal delay. Thus, even slight resistance difference between the gate lines may be revealed by brightness difference. In contrast, the active matrix substrate of Embodiment 1 can suppress an influence of signal delay per gate line. Therefore, the active matrix substrate of Embodiment 1 can be suitably used for the active matrix driving mode by polarity inversion driving.

In the case of gate triple scan driving in which pixels with the same color are arranged in the row direction, the number of gate lines is treble with respect to the resolution, and thus the pitches of the gate lines need to be narrow. The active matrix substrate of Embodiment 1 can be suitably used for such a driving mode.

Figure 5:
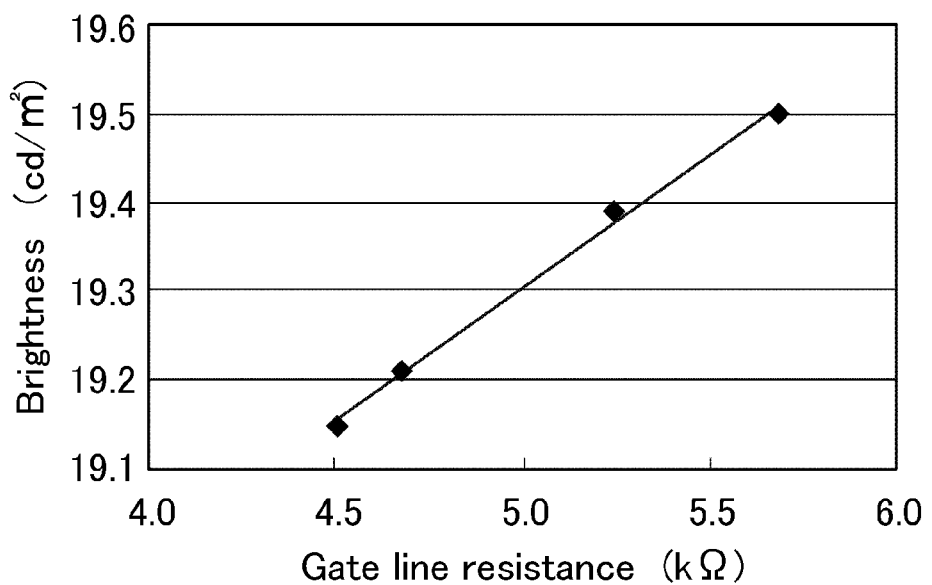
FIG. 5 is a graph showing the correlation between gate line resistance and brightness of a pixel on a gate line when an image is displayed in gray level.

FIG. 5 is a graph (actually measured values) showing the correlation between the gate line resistance and the brightness of a pixel on the gate line when an image is displayed in gray level. As shown in FIG. 5, a higher gate line resistance (kΩ) causes a higher brightness ($cd/m^2$), and variations in gate line resistance affect actual display quality.

Embodiment 2

Embodiment 2 is one example of the active matrix substrate (wiring board) of the present invention which can be used as a substrate constituting a liquid crystal display panel. The active matrix substrate of Embodiment 2 is similar to the active matrix substrate of Embodiment 1 except that each source line comprises a gate metal portion and a source metal portion.

Figure 6:
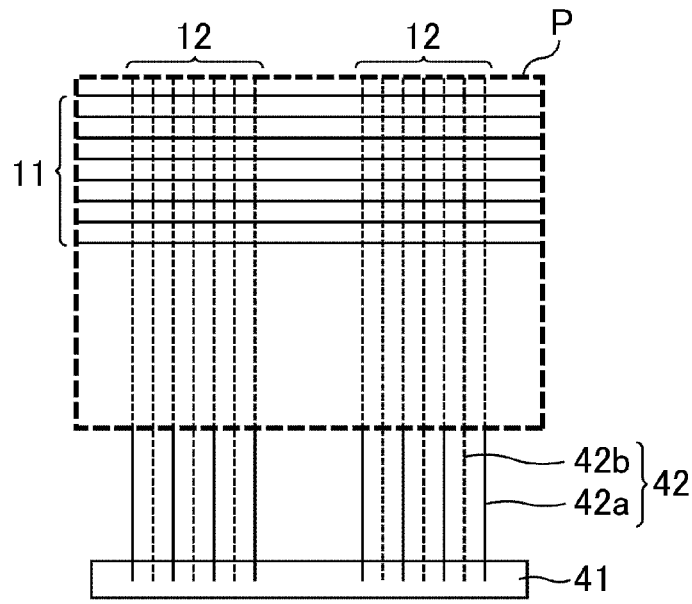
FIG. 6 is a schematic plan view showing the line arrangement of an active matrix substrate of Embodiment 2.
Figure 7:
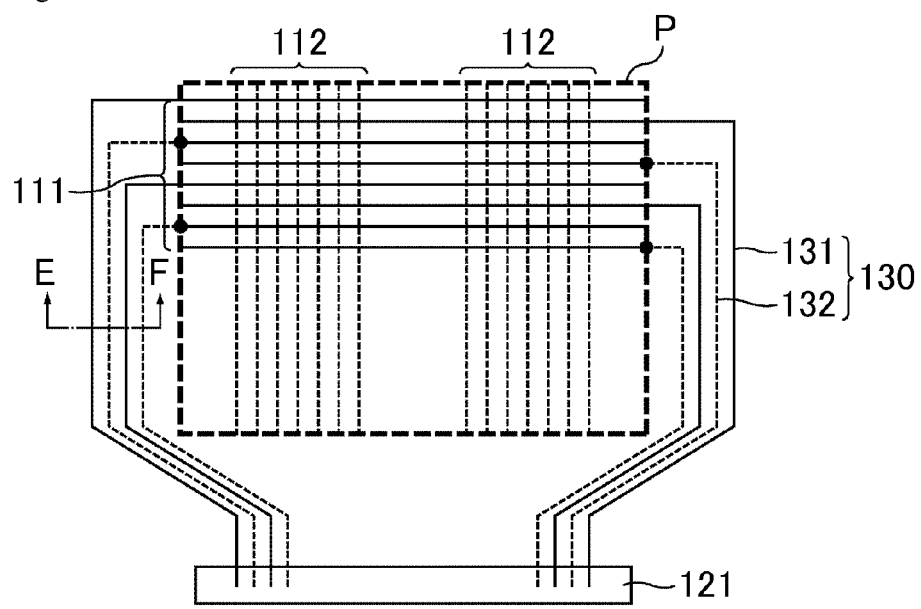
FIG. 7 is a schematic plan view showing one example of the arrangement of connection lines for frame downsizing.
Figure 8:
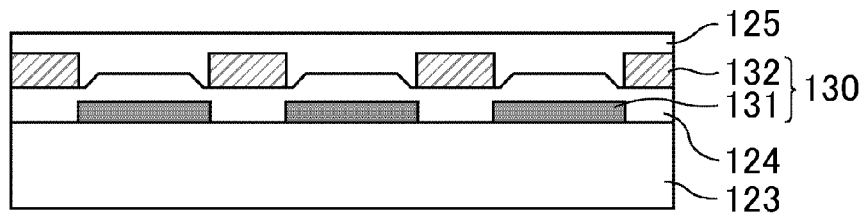
FIG. 8 is a schematic cross-sectional view along the E-F line in FIG. 7.
Figure 9:
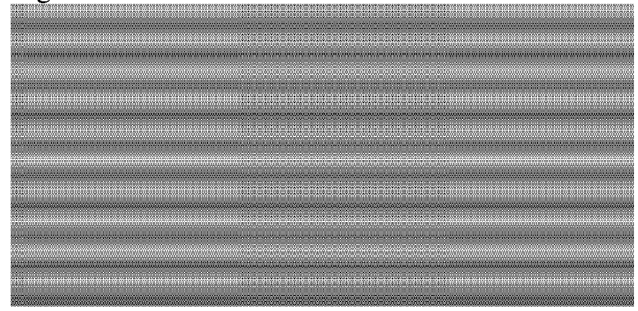
FIG. 9 is a photograph showing unevenness in brightness (moire) at a display region with the arrangement of the connection lines shown in FIG. 7.

FIG. 6 is a schematic plan view showing the wiring structure of the active matrix substrate of Embodiment 2. As shown in FIG. 6, the active matrix substrate of Embodiment 2 comprises a display region (control region) P provided with multiple gate lines 11 and multiple source lines 12. The gate lines 11 extend in the row direction and the source lines 12 extend in the column direction. Multiple connection lines 42 formed from different materials extend from the source driver 41 in order alternately, and are connected with the corresponding source lines 12. The connection lines 42 extend in the column direction.

As mentioned above, the frame can be easily downsized by allowing the lines formed from a gate metal and the lines formed from a source metal to extend from the source driver alternately, that is, producing adjacent connection lines by different production processes, in different layer arrangements, and from different materials.

The present application claims priority to Patent Application No. 2009-262768 filed in Japan on Nov. 18, 2009 under the Paris Convention and provisions of national law in a designated State, the entire contents of which are hereby incorporated by reference.

EXPLANATION OF SYMBOLS 11, 111: gate line
12, 112: source line
21, 121: gate driver
22: connection line
22a: gate metal portion
22b: source metal portion
23, 123: insulation substrate
24, 124: first insulating layer
25, 125: second insulating layer
31: contact portion
41: source driver
42: connection line
42a: gate metal portion
42b: source metal portion
130: connection line
131: connection line formed from gate metal
132: connection line formed from source metal
P: display region

The invention claimed is:

1. A wiring board including layers, comprising:
   a control region including:
      multiple gate lines extending in a row direction, and multiple source lines extending in a column direction; and
   a peripheral region including:
      a gate driver connected with the gate lines,
      a source driver connected with the source lines, and
      multiple connection lines which extend around the control region and which connect the gate driver with the gate lines, wherein
   each of the connection lines including a gate metal portion formed from a material of the gate lines and a source metal portion formed from a material of the source lines,
   an insulating layer is disposed between the gate metal portion and the source metal portion,
   the gate metal portion and the source metal portion are connected with each other via a contact portion which penetrates the insulating layer,
   each of the connection lines extends from one of the layers of the wiring board to a different one of the layers of the wiring board at the contact portion, and
   in each of the connection lines, a ratio of a length of the gate metal portion and that of a length of the source metal portion to an entire length of the connection line is substantially identical among the connection lines.

2. The wiring board according to claim 1,
   wherein connection lines formed from a material of the gate lines and a material of the source lines extend from the gate driver alternately in order.

3. The wiring board according to claim 1, further comprising multiple source connection lines connecting the source driver with the source lines,
   wherein connection lines formed from a material of the gate lines and a material of the source lines extend from the source driver alternately in order.

4. The wiring board according to claim 1,
   wherein the connection lines extend from the gate driver alternately in order, and the connection lines extending from both left and right ends alternately in order are connected with the respective gate lines in an ascending order of the row number.

5. The wiring board according to claim 1,
   wherein the contact portion is placed at substantially the middle point of the connection line.

6. The wiring board according to claim 1,
   wherein the contact portions of a pair of the connection lines adjacent to each other are placed at different positions in the column direction.

7. The wiring board according to claim 1, further comprising a switching element for each of pixels surrounded by the gate lines and the source lines.

8. The wiring board according to claim 7,
   wherein polarity of the pixels in one column is different from that of the pixels in an adjacent column.

9. The wiring board according to claim 7,
   wherein polarity of one pixel is different from that of an adjacent pixel.

10. A display apparatus, comprising the wiring board according to claim 1.

* * * * *